(12) United States Patent
Liu

(10) Patent No.: US 10,763,318 B2
(45) Date of Patent: Sep. 1, 2020

(54) ORGANIC LIGHT-EMITTING DIODE (OLED) IMAGE DISPLAY APPARATUS DRIVEN BY SILICON-BASED COMPLEMENTARY METAL OXIDE SEMICONDUCTOR (CMOS) AND MANUFACTURING METHOD

(71) Applicant: SHENZHEN DIANBOND TECHNOLOGY CO., LTD, Shenzhen, Guangdong (CN)

(72) Inventor: Ping Liu, Guangdong (CN)

(73) Assignee: SHENZHEN DIANBOND TECHNOLOGY CO., LTD., Shenzhen, Guangdong (CN)

( * ) Notice: Subject to any disclaimer, the term of this patent is extended or adjusted under 35 U.S.C. 154(b) by 253 days.

(21) Appl. No.: 15/981,436

(22) Filed: May 16, 2018

(65) Prior Publication Data
US 2018/0261659 A1 Sep. 13, 2018

Related U.S. Application Data

(63) Continuation of application No. PCT/CN2016/095535, filed on Aug. 16, 2016.

(30) Foreign Application Priority Data

Nov. 17, 2015 (CN) .......................... 2015 1 0790707

(51) Int. Cl.
*H01L 27/32* (2006.01)
*G09G 3/3208* (2016.01)

(52) U.S. Cl.
CPC ...... *H01L 27/3255* (2013.01); *H01L 27/3213* (2013.01); *H01L 27/3218* (2013.01);
(Continued)

(58) Field of Classification Search
CPC ............. H01L 27/3255; H01L 27/3218; H01L 27/3213; H01L 2227/323; G09G 2300/0408; G09G 3/3208
See application file for complete search history.

(56) References Cited

U.S. PATENT DOCUMENTS 5,655,940 A * 8/1997 Hodson .................... G09G 3/22
313/495
6,624,570 B1 9/2003 Nishio et al.
(Continued)

FOREIGN PATENT DOCUMENTS

| CN | 101414431 A | 4/2009 |
|---|---|---|
| CN | 105336762 A | 2/2016 |
| JP | 2010066486 A | 3/2010 |

OTHER PUBLICATIONS

International Search Report (English and Chinese) issued in PCT/CN2016/095535 dated Nov. 25, 2016.

*Primary Examiner* — Kwang-Su Yang
(74) *Attorney, Agent, or Firm* — Hamre, Schumann, Mueller & Larson, P.C.

(57) ABSTRACT

An OLED image display apparatus driven by a silicon-based CMOS and a manufacturing method are disclosed, where the apparatus includes four same microdisplay units formed through exposure by using a same mask, where each microdisplay unit includes: a display controller, a row driver, a column driver, and a rectangular display effective area, where one of vertexes of each rectangular display effective area is close to each other to form one rectangular whole display effective area, and there is no electronic component between any two rectangular display effective areas. Through proper layout designing and exposure field splicing, the OLED image display apparatus that is driven by a silicon-based CMOS and that has a larger area is implemented.

8 Claims, 2 Drawing Sheets

(52) U.S. Cl.
CPC ... *G09G 3/3208* (2013.01); *G09G 2300/0408* (2013.01); *H01L 2227/323* (2013.01)

(56) References Cited

U.S. PATENT DOCUMENTS

| | | | |
|---|---|---|---|
| 8,797,304 B2* | 8/2014 | Koyama | G06F 3/0412 345/207 |
| 2002/0173215 A1 | 11/2002 | Freidhoff et al. | |
| 2006/0012733 A1* | 1/2006 | Jin | G06F 1/13336 349/73 |
| 2006/0044215 A1 | 3/2006 | Brody et al. | |
| 2007/0052614 A1* | 3/2007 | Zimmerman | G09F 9/305 345/1.1 |
| 2007/0176861 A1* | 8/2007 | Tada | G09G 3/3258 345/77 |
| 2013/0099700 A1* | 4/2013 | Kreye | G06F 3/0412 315/320 |

* cited by examiner

ORGANIC LIGHT-EMITTING DIODE (OLED) IMAGE DISPLAY APPARATUS DRIVEN BY SILICON-BASED COMPLEMENTARY METAL OXIDE SEMICONDUCTOR (CMOS) AND MANUFACTURING METHOD

BACKGROUND OF THE INVENTION

Field of the Invention

The present application relates to integrated OLED display apparatuses, and in particular, to an OLED image display apparatus driven by a silicon-based CMOS and a manufacturing method.

Related Arts

An organic light-emitting diode (OLED) has advantages such as high luminous brightness, a low drive voltage, a high response speed, no visual angle limitation, low power consumption, being ultra-light and ultra-thin, being available in any shape, red, green and blue monochrome color outputs or a white color output, and a long service life, and has a tremendous application prospect in a field of a display, or the like. OLED microdisplay combined with a silicon-based CMOS driving circuit can integrate functions such as image display, signal processing, and control.

FIG. 1 shows a shape in which microdisplay devices 71 are distributed in a silicon chip 70. A size of the silicon chip is typically 200 mm in diameter. A maximum area of microdisplay is decided by an exposure field, and is generally far smaller than an area of the silicon chip. Therefore, up to a hundred microdisplays may be produced on one silicon chip. A specific manufacturing manner is: a bearing piece platform of a photoetching machine moves, when carrying a silicon chip, to each exposure field location, and perform exposure of microdisplay at this location. Then, the silicon chip is moved step by step to a next exposure field location to perform next exposure, until an exposure pattern fully covers an entire available area of the silicon chip. Such an exposure manner is referred to as stepping exposure. Spacings between microdisplay devices form a scribe line 72. In a back-end process, a microdisplay chip is cut off along the scribe line by using a scribe knife, and then is encapsulated to form each and every microdisplay product.

High-resolution and large-area display may be applied to different fields. Currently, a main stream exposure manner is stepping or scanning exposure. With a gradual increase of a display screen size, an effective exposure area of a stepping exposure machine is limited, and an effective area of a mask cannot cover an entire display screen. Therefore, for an over-1.2-inch display screen, one-off exposure cannot be implemented and spliced exposure needs to be used, and production of one entire display screen is completed through a plurality of times of exposure.

SUMMARY OF THE INVENTION

To overcome disadvantages of the prior art, the present application provides an OLED image display apparatus driven by a silicon-based CMOS and a manufacturing method, to manufacture the OLED image display apparatus that is driven by a silicon-based CMOS and that implements a larger area.

An OLED image display apparatus driven by a silicon-based CMOS is provided, including four same microdisplay units formed through exposure by using a same mask: a first microdisplay unit, a second microdisplay unit, a third microdisplay unit, and a fourth microdisplay unit, where each microdisplay unit includes: a display controller, a row driver, a column driver, and a rectangular display effective area, where one of vertexes of each rectangular display effective area is close to each other to form one rectangular whole display effective area, and there is no electronic component between any two rectangular display effective areas.

Preferably, in each microdisplay unit, the row driver and the column driver are respectively located on two adjacent sides of the rectangular display effective area.

Preferably, in each microdisplay unit, the display controller is located on a side that is of the rectangular display effective area and that is the same as a side on which the row driver is located.

Preferably, each display effective area includes a plurality of rectangular pixels, each rectangular pixel includes four rectangular subpixels, and one of vertexes of each rectangular subpixel is close to each other.

Preferably, the rectangular display effective area is a rectangle or a square.

The present application further provides a manufacturing method for the OLED image display apparatus driven by a silicon-based CMOS, including the following steps:
moving a silicon chip to a first exposure field location, and forming, by an exposure system, the first microdisplay unit through exposure by using the mask;
moving the silicon chip to a second exposure field location, rotating the mask by 90° along a specified direction, and forming, by the exposure system, the second microdisplay unit through exposure by using the mask;
moving the silicon chip to a third exposure field location, further rotating the mask by 90° along the specified direction, and forming, by the exposure system, the third microdisplay unit through exposure by using the mask; and
moving the silicon chip to a fourth exposure field location, further rotating the mask by 90° along the specified direction, and forming, by the exposure system, the fourth microdisplay unit through exposure by using the mask.

Preferably, in each microdisplay unit, the row driver and the column driver are respectively located on two adjacent sides of the rectangular display effective area.

Preferably, in each microdisplay unit, the display controller is located on a side that is of the rectangular display effective area and that is the same as a side on which the row driver is located.

Preferably, each display effective area includes a plurality of rectangular pixels, each rectangular pixel includes four rectangular subpixels, and one of vertexes of each rectangular subpixel is close to each other.

Preferably, the rectangular display effective area is a rectangle or a square.

The present application provides the OLED image display apparatus that is driven by a silicon-based CMOS and that implements a larger area through proper layout designing and exposure field splicing.

BRIEF DESCRIPTION OF THE DRAWINGS

The present application will become more fully understood from the detailed description given herein below for illustration only, and thus are not limitative of the present application, and where.

DETAILED DESCRIPTION OF THE INVENTION

The following further describes preferred embodiments of the present application in detail.

First Embodiment

Figure 1:
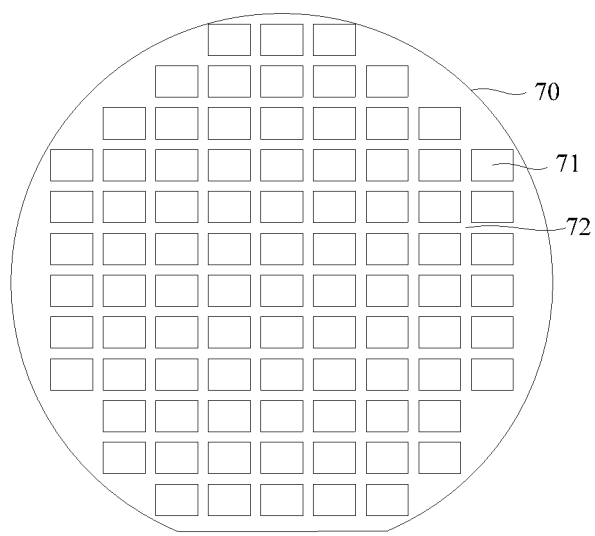
FIG. 1 is a shape of an existing OLED image display apparatus.
Figure 2:
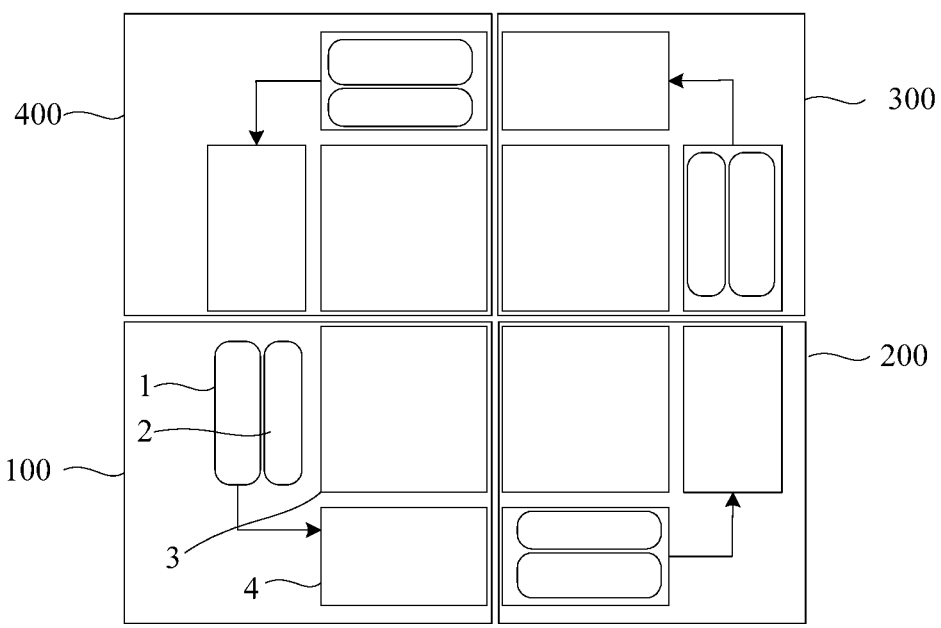
FIG. 2 is a layout diagram of a silicon-based and large-size OLED display apparatus according to Embodiment 1 of the present application.

Referring to FIG. 2, FIG. 2 is a schematic diagram of an OLED display apparatus of Embodiment 1. This embodiment provides an OLED display apparatus driven by a monocrystalline silicon-based CMOS. The apparatus includes four same microdisplay units 100, 200, 300, and 400, and the four microdisplay units are respectively complete OLED microdisplays. Using the microdisplay unit 100 as an example, the microdisplay unit 100 includes a display controller 1, a row driver 2, a display effective area 3, and a column driver 4, and the display controller 1 controls the row driver and the column driver. The microdisplay unit 100 is designed to be capable of completing exposure within one exposure field, and therefore a diagonal line of the display effective area may reach one inch at most. The row driver 2 and the column driver 4 are respectively located on two adjacent sides of the display effective area 3, and there is no electronic component on the other two sides of the display effective area 3.

Figure 3:
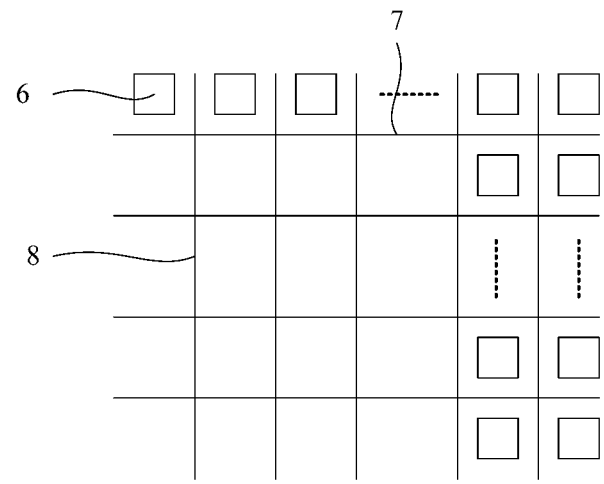
FIG. 3 is a layout diagram of a display effective area of a microdisplay unit according to Embodiment 1 of the present application.

For the display effective area of the microdisplay unit 100, refer to FIG. 3. Pixels of the display effective area are designed to be arranged in a square matrix, and the display effective area includes row lines 7, column lines 8, and pixels 6. The row lines 7 and the column lines 8 are respectively connected to the row driver 2 and the column driver 4, the row lines 7 and the column lines 8 are built in an inner side of the pixels 6, and the pixels 6 are an outer-most edge of this array.

Figure 4:
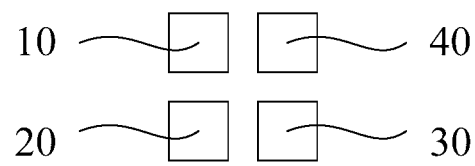
FIG. 4 is a layout diagram of subpixels according to Embodiment 1 of the present application.

The pixels 6 are connected to the row lines 7 and the column lines 8, and the pixels 6 are designed to be squares. Referring to FIG. 4, the pixel 6 includes a subpixel 10, a subpixel 40, a subpixel 20, and a subpixel 30. Each subpixel occupies one location, the locations are interchangeable, and all the subpixels are designed to be squares.

The display is formed by using a method of exposure splicing. The microdisplay unit 100 is within a light field of a stepping exposure system, and the microdisplay unit 100 is implemented by using a mask. Then, by using the mask, a silicon chip is moved step by step to a next exposure field location to perform second exposure, and a mask pattern at the location rotates by 90° relative to the microdisplay unit 100, to form a microdisplay unit 200. Then, by using the mask, the silicon chip is moved step by step to a next exposure field location to perform third exposure, and a mask pattern at the location further rotates by 90° relative to the microdisplay unit 200, to form a microdisplay unit 300. The silicon chip is moved step by step to a next exposure field location to perform fourth exposure, and a mask pattern at the location further rotates by 90° relative to the microdisplay unit 300, to form a microdisplay unit 400.

By changing a size of the diagonal line of the display effective area 3 of the microdisplay unit 100, a 1.2-inch to 2-inch square display screen may be formed. If the size of the diagonal line of the display effective area 3 of the microdisplay unit is 0.7 inch, a finally formed display screen has a square effective area and a 1.4-inch diagonal line.

Second Embodiment

Figure 5:
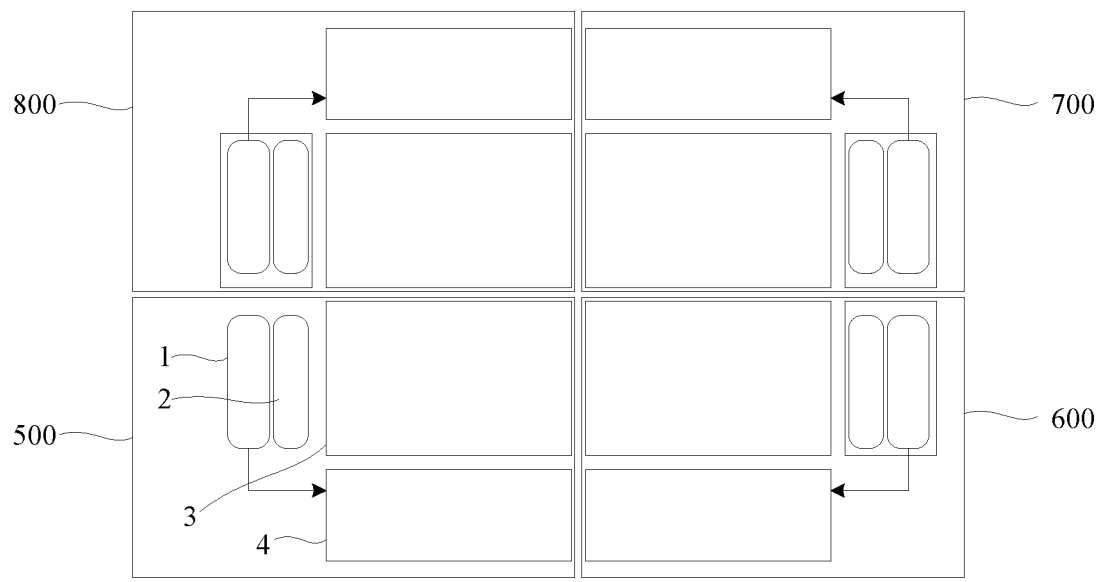
FIG. 5 is a layout diagram of a silicon-based and large-size OLED display apparatus according to Embodiment 2 of the present application.

Embodiment 2 has a structure that is the same as that of Embodiment 1. Referring to FIG. 5, FIG. 5 is a schematic diagram of an OLED display apparatus of this embodiment. This embodiment provides an OLED display apparatus driven by a monocrystalline silicon-based CMOS. The apparatus includes four same microdisplay units 500, 600, 700, and 800. Using the microdisplay unit 500 as an example, the microdisplay unit 500 is a complete OLED microdisplay and includes a display controller 1, a row driver 2, a display effective area 3, and a column driver 4, and the display controller 1 controls the row driver and the column driver. The microdisplay unit 500 is designed to be capable of completing exposure within one exposure field, and therefore a diagonal line of the display effective area may reach one inch at most. The row driver 2 and the column driver 4 are respectively located on two adjacent sides of the display effective area 3, and there is no electronic component on the other two sides of the display effective area 3.

Similar to Embodiment 1, for a layout of the display effective area of the microdisplay unit 500, refer to FIG. 3 in Embodiment 1. A difference is that pixels of the display effective area are designed to be arranged in a rectangular matrix. A typical aspect ratio is 16:9 or 4:3. The display effective area still includes row lines 7, column lines 8, and pixels 6. The row lines 7 and the column lines 8 are respectively connected to the row driver 2 and the column driver 4, the row lines 7 and the column lines 8 are built in an inner side of the pixels 6, and the pixels 6 are an outer-most edge of this array.

The pixels 6 are connected to the row lines 7 and the column lines 8, and the pixels 6 are still designed to be squares. Referring to FIG. 4 in Embodiment 1, the pixel 6 includes a subpixel 10, a subpixel 40, a subpixel 20, and a subpixel 30. Each subpixel occupies one location, the locations are interchangeable, and all the subpixels are designed to be squares.

The display is formed by using a method of exposure splicing. The microdisplay unit 500 is within a light field of a stepping exposure system, and the microdisplay unit 500 is implemented by using a mask. Then, by using the mask, a silicon chip is moved step by step to a diagonally opposite next exposure field location to perform second exposure, and a mask pattern at the location rotates by 180° relative to the microdisplay unit 500, to form a microdisplay unit 700. Then, by using another mask, where the another mask is bilaterally symmetrical to the former mask, the silicon chip is moved step by step to a next exposure field location to perform third exposure, and a formed microdisplay unit 600 is bilaterally symmetrical to the microdisplay unit 500. Then, by using the another mask, the silicon chip is moved step by step to a diagonally opposite next exposure field location to perform fourth exposure, and a mask pattern at the location rotates by 180° relative to the microdisplay unit 600, to form a microdisplay unit 800.

By changing a size of the diagonal line of the display effective area 3 of the microdisplay unit, a 1.2-inch to 2-inch rectangular display screen may be formed. For example, if the size of the diagonal line of the display effective area 3 of the microdisplay unit is 0.7 inch and a aspect ratio is 4:3, a finally formed display screen has an effective area whose diagonal line is 1.4 inches and an aspect ratio of 4:3.

Although the present application is described above in further detail through specific preferred embodiments, the present application is not limited to the specific embodiments. It should be understood by persons of ordinary skill in the art that any simple deduction or replacement made without departing from the spirit of the present application shall fall within the patent protection scope determined by the submitted claims in the present application.

What is claimed is:

1. A manufacturing method for an organic light-emitting diode (OLED) image display apparatus driven by a silicon-based complementary metal oxide semiconductor (CMOS), the OLED image display apparatus driven by the silicon-based CMOS comprising four same microdisplay units formed through exposure by using a same mask, the four same microdisplay units including: a first microdisplay unit, a second microdisplay unit, a third microdisplay unit, and a fourth microdisplay unit, wherein each microdisplay unit comprises: a display controller, a row driver, a column driver, and a rectangular display effective area, and wherein one of vertexes of each rectangular display effective area is close to each other to form one rectangular whole display effective area, there is no electronic component between any two rectangular display effective areas, and the rectangular display effective area is a square, the manufacturing method comprising the following steps:
moving a silicon chip to a first exposure field location, and forming, by an exposure system, the first microdisplay unit through exposure by using the mask;
moving the silicon chip to a second exposure field location, rotating the mask by 90° along a specified direction, and forming, by the exposure system, the second microdisplay unit through exposure by using the mask;
moving the silicon chip to a third exposure field location, further rotating the mask by 90° along the specified direction, and forming, by the exposure system, the third microdisplay unit through exposure by using the mask; and
moving the silicon chip to a fourth exposure field location, further rotating the mask by 90° along the specified direction, and forming, by the exposure system, the fourth microdisplay unit through exposure by using the mask.

2. The manufacturing method according to claim 1, wherein in each microdisplay unit, the row driver and the column driver are respectively located on two adjacent sides of the rectangular display effective area.

3. The manufacturing method according to claim 1, wherein in each microdisplay unit, the display controller is located on a side that is of the rectangular display effective area and that is the same as a side on which the row driver is located.

4. The manufacturing method according to claim 1, wherein each display effective area comprises a plurality of rectangular pixels, each rectangular pixel comprises four rectangular subpixels, and one of vertexes of each rectangular subpixel is close to each other.

5. A manufacturing method for an organic light-emitting diode (OLED) image display apparatus driven by a silicon-based complementary metal oxide semiconductor (CMOS), the OLED image display apparatus driven by a silicon-based CMOS comprising four microdisplay units formed through exposure by using two bilaterally symmetrical masks: a first microdisplay unit, a second microdisplay unit, a third microdisplay unit, and a fourth microdisplay unit, wherein the first microdisplay unit and the second microdisplay unit are formed through exposure by using one of the two bilaterally symmetrical masks, and the third microdisplay unit and the fourth microdisplay unit are formed through exposure by using another of the two bilaterally symmetrical masks, wherein each microdisplay unit comprises: a display controller, a row driver, a column driver, and a rectangular display effective area, and wherein one of vertexes of each rectangular display effective area is close to each other to form one rectangular whole display effective area, there is no electronic component between any two rectangular display effective areas, and the rectangular display effective area is a rectangle;

the manufacturing method comprising:
moving a silicon chip to a first exposure field location, and forming, by an exposure system, the first microdisplay unit through exposure by using a first mask;
moving the silicon chip to a second exposure field location, and forming, by the exposure system, the second microdisplay unit through exposure by using the first mask, wherein the second exposure field location rotates by 180° relative to the first microdisplay unit;
moving the silicon chip to a third exposure field location, and forming, by the exposure system, the third microdisplay unit through exposure by using a second mask, wherein the second mask is bilaterally symmetrical to the first mask and the third microdisplay unit is bilaterally symmetrical to the second microdisplay unit;
moving the silicon chip to a fourth exposure field location, and forming, by the exposure system, the fourth microdisplay unit through exposure by using the second mask, wherein the fourth exposure field location rotates by 180° relative to the third microdisplay unit.

6. The manufacturing method according to claim 5, wherein in each microdisplay unit, the row driver and the column driver are respectively located on two adjacent sides of the rectangular display effective area.

7. The manufacturing method according to claim 5, wherein in each microdisplay unit, the display controller is located on a side that is of the rectangular display effective area and that is the same as a side on which the row driver is located.

8. The manufacturing method according to claim 5, wherein each display effective area comprises a plurality of rectangular pixels, each rectangular pixel comprises four rectangular subpixels, and one of vertexes of each rectangular subpixel is close to each other.

* * * * *